(12) United States Patent
Shinozuka

(10) Patent No.: US 6,547,504 B2
(45) Date of Patent: Apr. 15, 2003

(54) WAFER CARRYING SYSTEM AND CARRYING METHOD THEREOF

(75) Inventor: Masamitsu Shinozuka, Toyo (JP)

(73) Assignee: Sumitomo Eaton Nova Corporation, Tokyo (JP)

(*) Notice: Subject to any disclaimer, the term of this patent is extended or adjusted under 35 U.S.C. 154(b) by 0 days.

(21) Appl. No.: 09/847,317

(22) Filed: May 3, 2001

(65) Prior Publication Data

US 2002/0014390 A1 Feb. 7, 2002

(30) Foreign Application Priority Data

Jul. 28, 2000 (JP) .................................... 2000-228799

(51) Int. Cl.[7] ............................................. B65H 1/00
(52) U.S. Cl. ........................... 414/222.01; 318/568.16
(58) Field of Search .................. 414/754, 936, 414/937, 147, 935, 222.04, 222.05, 222.06

(56) References Cited

U.S. PATENT DOCUMENTS 4,775,281 A * 10/1988 Pretakis ...................... 118/500
6,037,733 A * 3/2000 Genov et al. ............ 414/222.01
6,164,894 A * 12/2000 Cheng .................... 318/568.16
6,313,596 B1 * 11/2001 Wyka et al. ................ 257/678

FOREIGN PATENT DOCUMENTS

JP 3-154791 7/1991

* cited by examiner

Primary Examiner—Kathy Matecki
Assistant Examiner—Michael J. Kwon
(74) Attorney, Agent, or Firm—Arent Fox Kintner Plotkin & Kahn, PLLC

(57) ABSTRACT

A wafer carrying system includes an intermediate cassette device having a plurality of wafer support holders, a robot arm device to carry wafers, an aligner unit to align the wafers, and a wafer feed and storage cassette. The wafers held by the robot arm device are transferred to the aligner unit are aligned in the intermediate cassette device, and are then directly delivered from the aligner unit to the wafer support holders of the intermediate cassette device.

26 Claims, 10 Drawing Sheets

WAFER CARRYING SYSTEM AND CARRYING METHOD THEREOF

BACKGROUND OF THE INVENTION

This invention broadly relates to a wafer carrying system, and in particular, to a wafer carrying system including an intermediate cassette device having a plurality of wafer support holders, a robot arm device for carrying a wafer, an aligner unit for aligning the wafer, and a wafer feed and storage cassette, and to a carrying method thereof.

Shown in FIG. 5B is a cross-sectional view of the wafer holding and rotating part 31. The wafer holding and rotating part 31 includes a vacuum chuck. The vacuum chuck has an opening 31-3 located at the top surface of 31. The opening 31-3 continues to a pathway for vacuum line 31-2. Vacuum drains 31-4 are compartments of suction opening 31-3. The wafer holding and rotating part 31 is holds wafer 22 by vacuum power.

Conventionally, as shown in FIG. 1, a wafer 101 is carried once from a wafer cassette 104 to an aligner unit 102 by a robot arm 105, and then, the aligned wafer 101 is carried to an intermediate cassette (shuttle) 103.

More specifically, the wafer 101 is aligned by the aligner unit 102 separately located from the intermediate cassette 103 to appropriately set the rotational position of the wafer 101 using a mark such as an orientation flat (a notch), and then, the wafer 101 is loaded on the intermediate cassette 103. Herein, it is to be noted that numeral 105 denotes a main cassette (a vacuum cassette) while numeral 106 denotes an unloading cassette (a shuttle).

For example, when the wafer 101 is carried from the wafer cassette 104 to the intermediate cassette 103, the carrying path is: the wafer cassette 104→(carriage by the robot arm 105)→the aligner unit 102→(carriage by the robot arm 105)→the intermediate cassette 103; and thus two carriages by the robot are necessary.

SUMMARY OF THE INVENTION

It is therefore an object of this invention to provide a wafer carrying system which is capable of carrying each wafer in single operation of a robot device, and which is capable of shortening the changing time of a treated wafer with an untreated wafer, and a carrying method thereof.

According to an aspect of the present invention, a wafer carrying system comprises an intermediate cassette device having a plurality of wafer support holders, a robot arm device to carry the wafer, an aligner unit mounted below and extendable into the intermediate cassette device to align the wafer, and a wafer feed and storage cassette.

With such a structure, the wafer held by the robot arm device is transferred to the aligner unit, and aligned in the intermediate cassette device, and then, directly delivered from the aligner unit to a plurality of wafer support holders of the intermediate cassette device.

The aligner unit has a positioner, and the wafer is centered by the positioner and transferred to a wafer holding and rotating part by the vertical movement of the wafer holding and rotating part of the aligner unit or the positioner.

Further, the wafer is centered by the positioner on the aligner unit in which the positioner is provided in a concentric manner, is transferred to the wafer holding and rotating part of the aligner unit, and is delivered to a next process by the vertical movement of the whole aligner unit.

The center of the aligner unit and the wafer loading center of the intermediate cassette device are disposed concentrically with each other.

The aligner unit is horizontally moved to the intermediate cassette device to transfer the wafer so that the center of the aligner unit and the wafer loading center of the intermediate cassette device are disposed concentrically with each other.

The intermediate cassette device is horizontally moved to the aligner unit so that the center of the aligner unit and the wafer loading center of the intermediate cassette device are disposed concentrically with each other.

The center of the positioner of the aligner unit and the center of the wafer holding and rotating part of the aligner are disposed concentrically with each other in the vertical direction.

The aligner unit can be vertically raised/lowered, and wafers are successively loaded from the aligner unit to an upper end of the stage to a lower end of the stage of a plurality of wafer support holders of the intermediate cassette device by the raising/lowering operation of the aligner unit.

The aligner unit is disposed on the wafer-loading-center locus on a wafer insertion path of the intermediate cassette device, and the aligner unit is horizontally moved to receive the wafer from the robot arm device.

The aligner unit is horizontally moved and receives the wafer from the robot arm device, and the intermediate cassette device is vertically moved to transfer the wafer.

The plurality of wafer support holders of the intermediate cassette device have an open-bottom cavity space part, and the aligner unit can be vertically raised/lowered within this among the cavity space part.

The positioner and the wafer holding and rotating part of the aligner unit can be vertically raised/lowered among the open-bottom cavity space part of the plurality of wafer support holders of the intermediate cassette device.

The intermediate cassette device can be vertically raised/lowered, and the wafers are successively transferred from said aligner unit to the plurality of wafer support holders of the intermediate cassette device, and moved from an upper stage to a lower stage of the intermediate cassette device by the raising/lowering operation of the intermediate cassette device.

The aligner unit is disposed on the horizontal moving line of the intermediate cassette device or on a wafer-loading-center locus during the rotation by the shuttle drive, the wafer is delivered by horizontally moving the intermediate cassette device, toward the aligner unit and the aligner unit is vertically moved.

The intermediate cassette device is horizontally moved to deliver the wafer, and the intermediate cassette device is vertically moved.

The wafer is delivered from the robot arm device to the aligner unit, the vertical position of which can be changed by up/down movement, and the aligner unit or the intermediate cassette is vertically moved to receive and transfer the wafer.

The robot arm device is vertically moved during the carriage of the wafer from the feed and storage cassette, and the wafer is delivered to the aligner unit, the position of which can be changed by vertical movement, and the aligner unit or the intermediate cassette is vertically moved to receive and load the wafer.

The wafers are loaded in the empty wafer holding shelves of the intermediate cassette device, the intermediate cassette device is unloaded, then the same reloading process occurs.

A sensor to detect an orientation flat (or notch) of the wafer is installed in an inclined stance on the aligner unit.

The untreated wafer is automatically carried into a wafer (vacuum) treatment chamber from a vacuum container, and the treated wafer is automatically carried out of the wafer (vacuum) treatment chamber to the vacuum container.

The main cassette device (vacuum cassette) which has untreated or treated wafers is stored in a sealed box for continuous transfer into the wafer treatment chamber.

The feed and storage cassette device is stored in a sealed box for continuous transfer into a clean room.

The aligner unit can be advanced into a holding part of the main cassette device, and the main cassette device or the aligner unit is vertically moved to receive or to transfer the wafer from the aligner unit.

The robot arm device is horizontally movable between a plurality of the wafer feed cassettes.

According to another aspect of the present invention, a wafer carrying system comprises a wafer carrying device to collectively deliver a plurality of wafers between a plurality of wafer holding shelves in a vacuum cassette device provided in a treatment device in a vacuum chamber, including a wafer-loading shuttle device and a wafer-unloading shuttle device disposed at the side of the vacuum cassette device.

The shuttle devices include shuttle cassettes having a plurality of wafer support holders corresponding to a plurality of the wafer holding shelves of the vacuum cassette device.

In this event, the shuttle cassette is movable between a delivery position to deliver the wafers to/from the cassette device and a waiting position distant therefrom.

Each of the plurality of wafer holds shelves holding the wafer in each center area. The plurality of wafer support holders supports each wafer at positions on both sides in the diameter direction and away from the center area.

Under this circumstance, an aligner unit is disposed in a carrying path to the shuttle device. Further, the wafer held by a robot arm device is transferred to the aligner unit in the shuttle device, which is the intermediate cassette device. In this condition, the wafers are aligned, and directly delivered from the aligner unit to the wafer support holders of the shuttle device, which is the intermediate cassette device.

According to still another aspect of the present invention, a wafer carrying method for a wafer carrying system includes an intermediate cassette device having a plurality of wafer support holders, a robot arm device to carry a wafer, an aligner unit to align the wafer, and a wafer feed and storage cassette, and delivering the wafer to the wafer support holder after the wafer is aligned, the method comprising the steps of: taking out the wafer from the feed and storage cassette by the robot arm device to the intermediate cassette device; transferring the held wafer to the wafer support device of the intermediate cassette device; transferring the wafer to the aligner unit and aligning the wafer; and directly delivering the aligned wafer to the wafer support holderr of the intermediate cassette device in the aligner unit.

More specifically, the orientation flat (a notch) alignment of a wafer (this operation is hereinafter referred to as "aligning") to be transferred to a swing-type cassette referred to as a vacuum cassette (hereinafter referred to as "shuttle") to collectively transfer silicon wafers is implemented in an aligner unit which can be raised/lowered in the shuttle (hereinafter referred to as "elevator-type (raising/lowering-type) aligner unit" in a device to carry treated and untreated silicon wafers out of/into a vacuum container in a device to treat works (the silicon wafers) in a vacuum chamber such as an ion implanter.

The carrying time of the wafer to the shuttle can be improved, thereby improving the wafer treatment capacity per unit time. For example, when the wafer is carried from the wafer cassette to the shuttle, the cassette is carried in the order of: the cassette→(carriage by the robot arm device)→the aligner unit→the intermediate cassette; and thus the carriage by the robot can be completed in single operation.

The shuttle and the aligner unit are conventionally located separately from each other; however, space in the device can be saved by disposing them together.

In accordance with the present invention, the loading time taking several minutes (for thirteen wafers) in a conventional system is substantially halved in an example of handling thirteen 12-inch wafers.

The carriage by the robot can be completed in single operation when an elevator-type aligner unit is used in carrying wafers to the shuttle. The robot which completes the carriage of the wafer to the aligner unit can fetch the next wafer without waiting for the aligning operation, and the carrying capacity of the robot can be improved.

In addition, the wafer can be aligned at each position of the shuttle by the elevator-type aligner unit. Further, carriage of one wafer by a robot device can be completed in single operation.

Still further, the changing time of a treated wafer and an untreated wafer can be shortened, and the wafer carrying system can be saved in space.

BRIEF DESCRIPTION OF THE DRAWINGS

FIGS. 4A and 4B show a detailed construction of the intermediate cassette, wherein FIG. 4A is a plan view and FIG. 4B is a sectional view;

DESCRIPTION OF PREFERRED EMBODIMENTS (First Embodiment)

A first embodiment of this invention will be described with reference to the drawings.

The overall construction of a wafer carrying system of this invention will be described with reference to FIG. 2.

Figure 1:
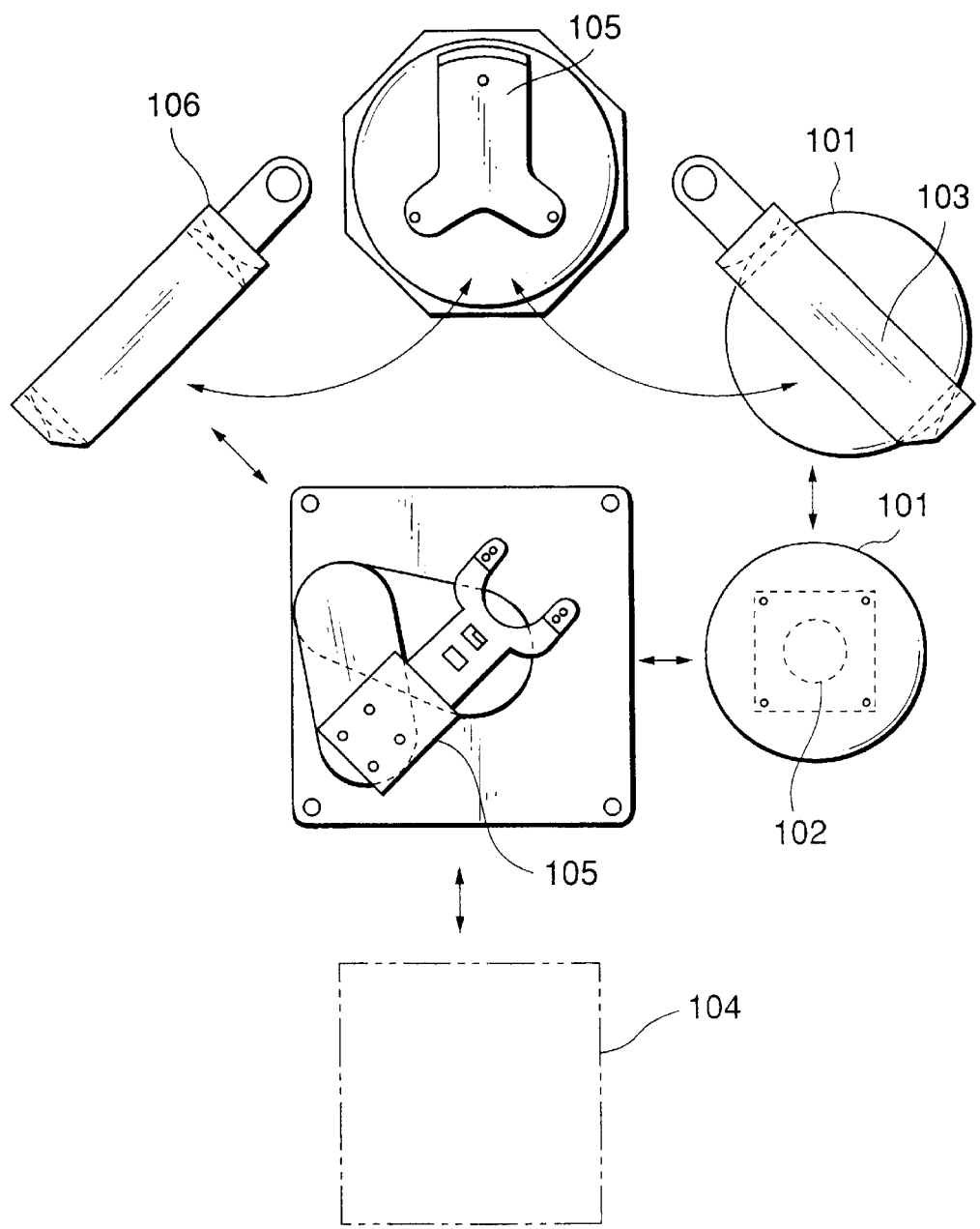
FIG. 1 is a view of a conventional wafer carrying system.
Figure 2:
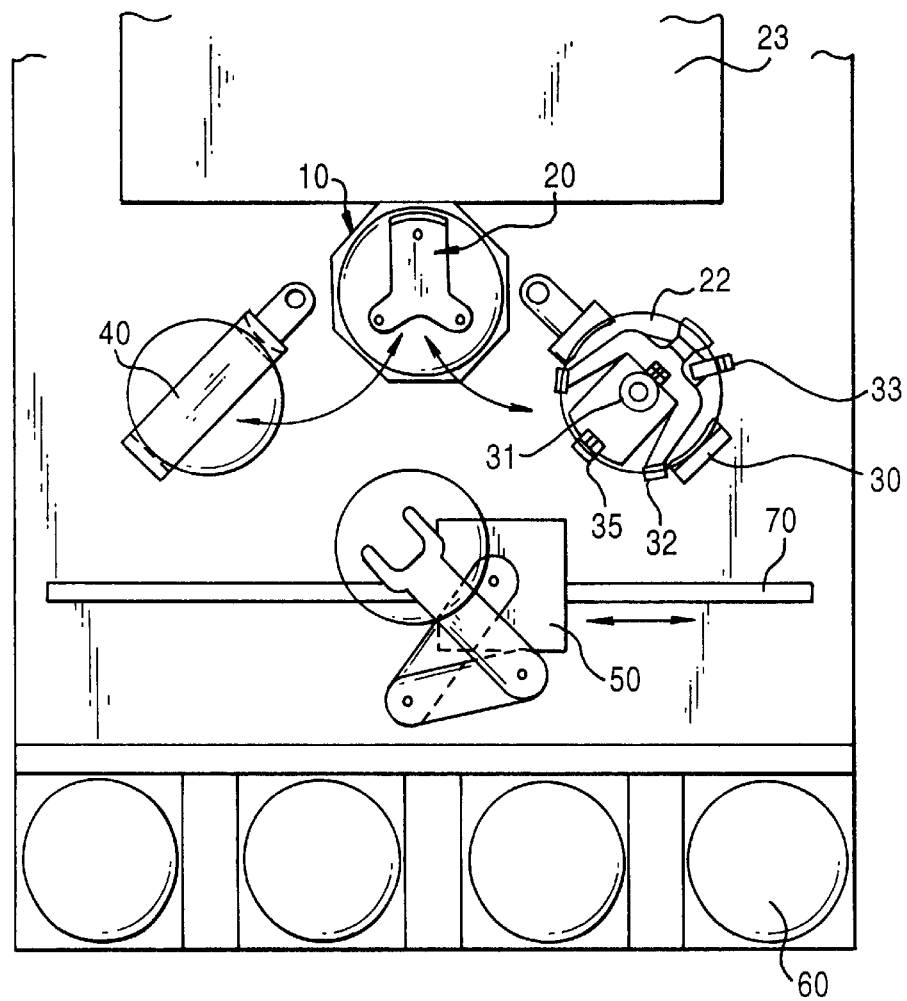
FIG. 2 is an overall schematic view of a wafer carrying system according to a first embodiment of this invention.

As shown in FIG. 2, the wafer carrying system collectively delivers thirteen wafers to/from, for example, thirteen wafer holding shelves in a main cassette device (a vacuum cassette) 20 provided on a vacuum container 10 in a batch-treatment-type ion implanter, and includes an intermediate cassette (a wafer-loading shuttle device) 30 and a wafer-unloading cassette device (a shuttle device) 40 which are disposed on either side of the main cassette 20. In this case, only a part of the vacuum container 10 is shown in the figure.

The intermediate cassette 30 and the wafer-unloading cassette 40 have thirteen wafer support holders corresponding to the thirteen wafer holding shelves. With such a structure, the intermediate cassette 30 and the wafer-unloading cassette 40 are turnable between a delivery position to deliver the wafers to/from the main cassette 20 and a waiting position away therefrom.

The first embodiment includes a handling device 50 for removing thirteen untreated wafers one-by-one from a wafer feed cassette 60 and delivering them to the intermediate cassette 30 which is at the waiting position, and for receiving thirteen treated wafers one-by-one from the wafer-unloading cassette device 40 in the waiting position and delivering them to the wafer feed cassette 60. The handling device 50 is horizontally movable along a rail 70.

Figure 3A:
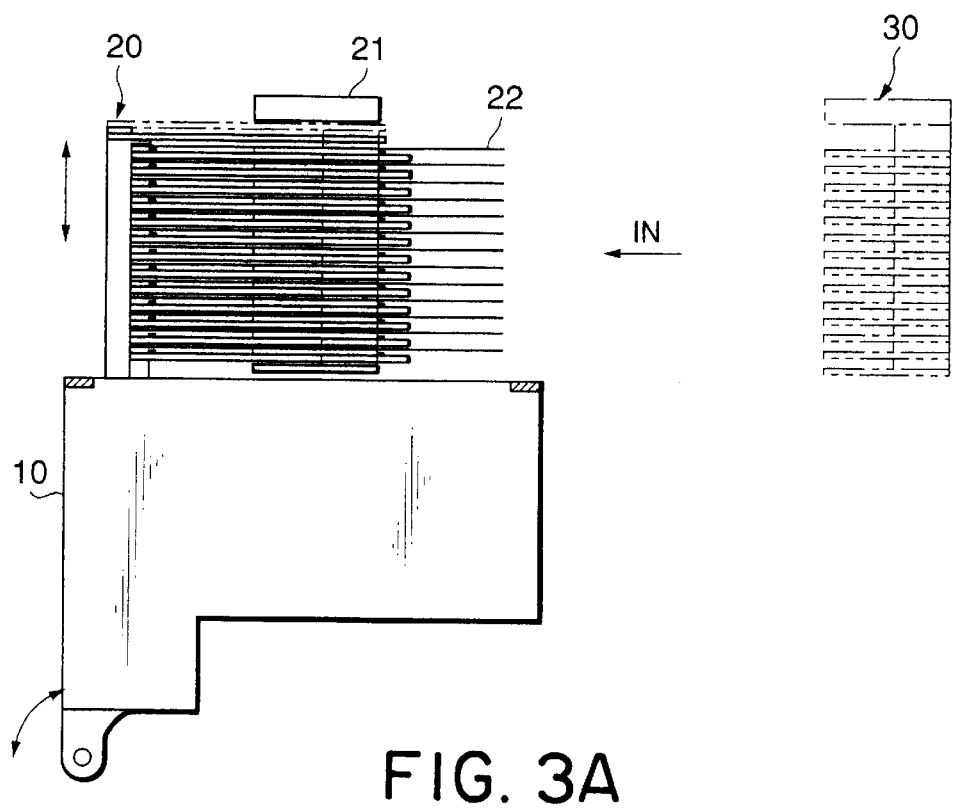
FIGS. 3A and 3B show the construction of a main cassette (a vacuum cassette) and an intermediate cassette, and the delivery state of a wafer, respectively.
Figure 3B:
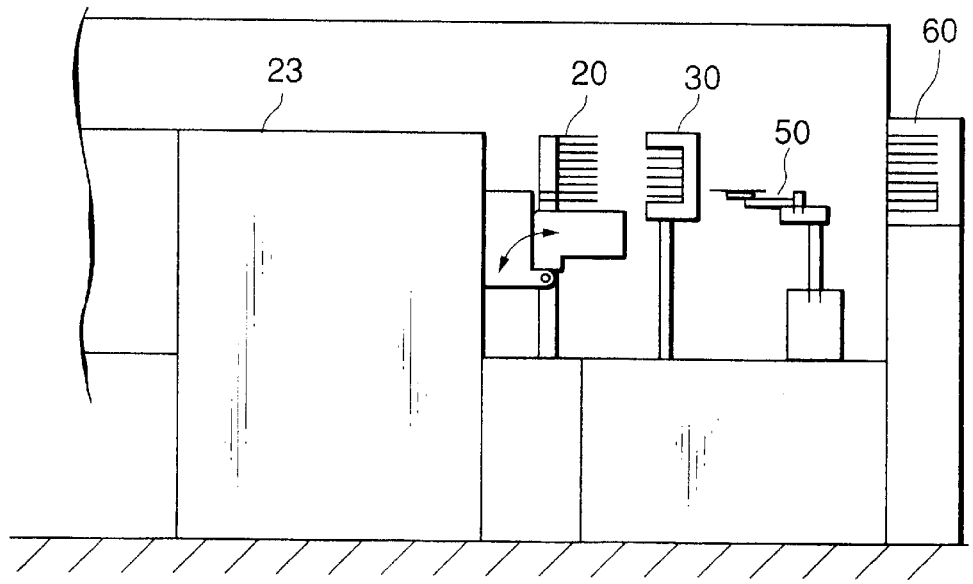

The main cassette device 20 has thirteen wafer holding shelves 21 as shown in FIGS. 3A and 3B, and each wafer holding shelf 21 holds a wafer 22 at a plurality of points in its center area. The main cassette device 20 can be inserted in/removed from the vacuum container 10, and the plurality of wafers 22 are delivered with the main cassette device 20 outside the vacuum container 10.

As illustrated in FIGS. 3A and 3B, the thirteen wafer holding shelves 21 in the main cassette device 20 are vertically movable by a given distance. When the thirteen untreated wafers 22 are collectively delivered from the intermediate cassette device 30 to the main cassette device 20, the thirteen wafer holding shelves 21 are initially at a position which is lowered by the given distance, and then raised by the given distance when the thirteen wafer support holders are at the delivery position. Thus, the thirteen untreated wafers can be collectively received.

Thus, the intermediate cassette device 30 can collectively deliver thirteen wafers (untreated) 22 to the main cassette device 20. Herein, numeral 23 denotes a wafer treatment chamber. In the wafer treatment chamber 23 where an untreated wafer is automatically carried into from a vacuum container, ions are implanted in the wafers 22 under the vacuum using an ion implanter (not shown).

The above-described structure is completely the same for the wafer-unloading cassette device 40, and thus, the illustration and description thereof will be omitted. When a plurality of treated wafers 22 are collectively delivered from the main cassette device 20 to the wafer-unloading cassette device 40, thirteen wafer holding shelves 21 are initially at a position which is raised by the given distance, and are then lowered by the given distance when thirteen wafer support holders are at the delivery position. Thus the thirteen treated wafers can be collectively delivered to thirteen wafer support holders.

Meanwhile, the handling device 50 of the known art (disclosed in, for example, Japanese Unexamined Patent Publication No. H03-154791) is utilized, and the illustration and description thereof will be thus omitted.

Then, the general operation of this carrying system will be described briefly.

(1) Thirteen untreated wafers 22 are loaded on the intermediate cassette device 30 in the waiting state by the handling device 50.

(2) When the ion implantation is completed in the vacuum container 10, the main cassette device 20, to which the treated wafers 22 are shifted, is raised from the vacuum container 10.

(3) To receive the treated wafers 22, the wafer-unloading cassette device 40 is turned to the wafer delivery position.

(4) The main cassette device 20 is lowered by a given distance (10 mm here) to deliver the treated wafers 22 to the wafer-unloading cassette device 40.

(5) The wafer-unloading cassette device 40 receives the treated wafers 22, and is turned to the original waiting position. The treated wafers 22 are thus collectively carried out of the main cassette device 20.

(6) After the wafer-unloading cassette device 40 is turned to the waiting position, the intermediate cassette device 30, which is in the waiting state in (1) above, is turned to the delivery position of the wafers 22.

(7) The main cassette device 20 is raised by 10 mm, and receives the untreated wafers 22 from the intermediate cassette device 30.

(8) The intermediate cassette device 30 is turned to the original waiting position.

(9) The main cassette device 20 receiving the untreated wafers 22 is stored in the vacuum container 10, and the untreated wafers 22 are shifted from the main cassette device 20 to the ion implantation position, and the ion implantation is started.

(10) The handling device 50 shifts the treated wafers 22 in the wafer-unloading cassette device 40 to the wafer feed cassette 60, and loads the untreated wafers 22 from a new wafer feed cassette 60 to the intermediate cassette 30.

Subsequently, an elevator-type (raising/lowering-type) aligner unit 300 will be described with reference to FIGS. 4A and 4B.

The elevator-type aligner unit 300 comprises a wafer holding and rotating part 31, a positioner 32, an orientation-flat (notch) detection part 33, and a raising/lowering drive part 34.

The wafer holding and rotating part 31 holds the reverse side of the wafer, and rotates the wafer. It can rotate the wafer in the forward direction (one-way direction) and in the reverse direction (backward direction) to detect the orientation flat (notch). Under this circumstance, the wafer is held by the vacuum chuck suction opening 31-3 located at the top of the surface of the wafer holding and rotating part 31.

The positioner 32 is disposed so that the center of the wafer and the rotation center of the wafer holding and rotating part 31 are concentric to each other, and is of a shape which does not interfere with a robot hand in centering the wafer only by loading the wafer.

Figure 4A:
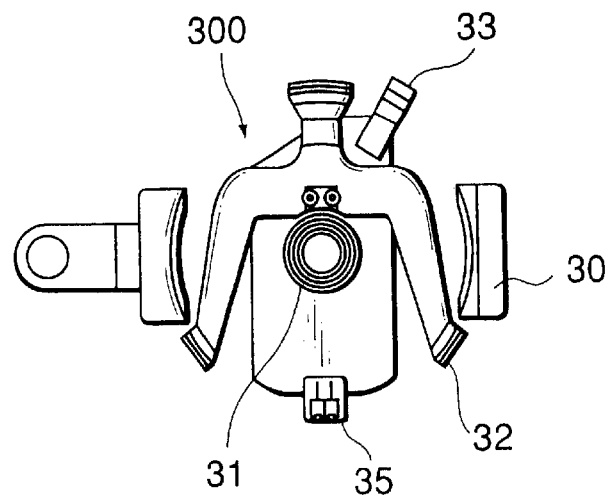
Figure 4B:
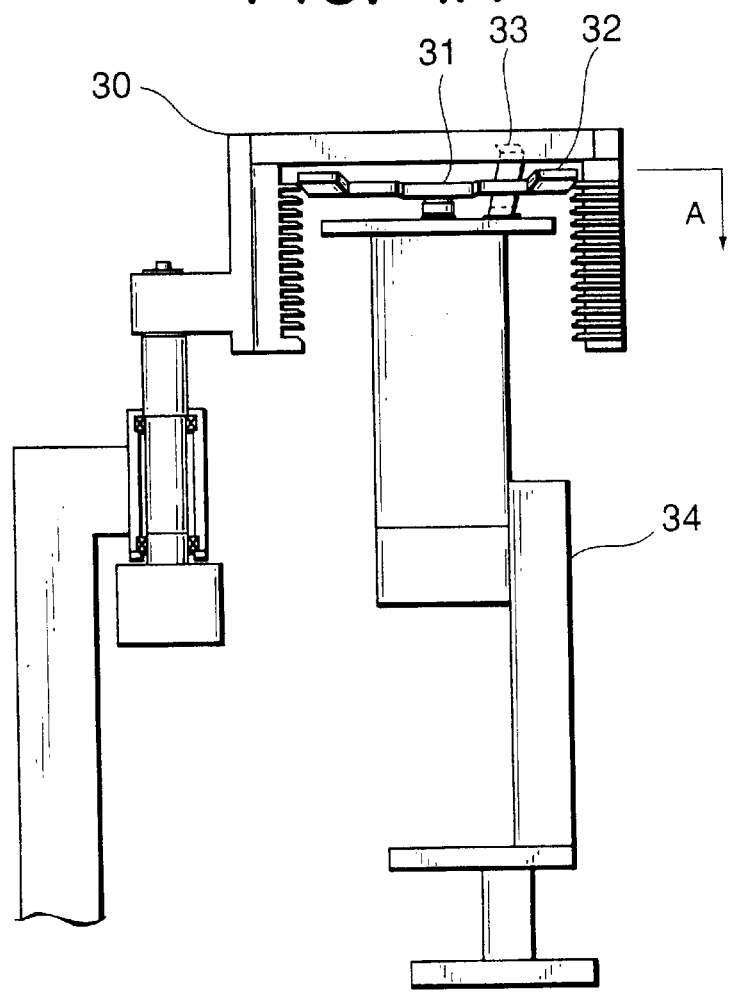
Figure 5A:
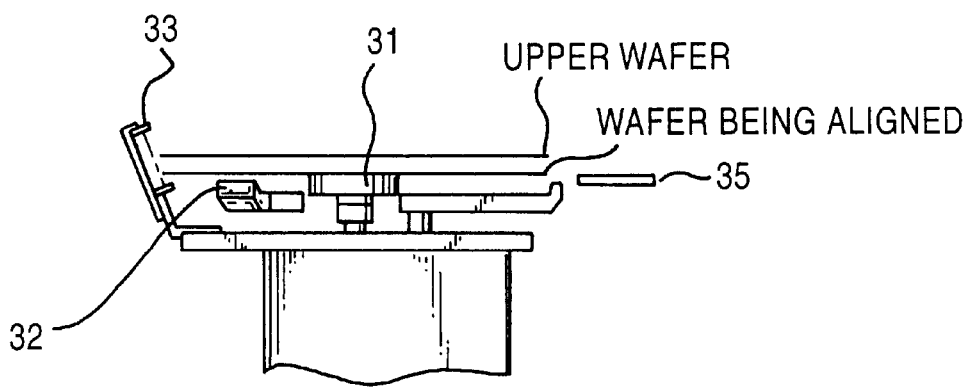
FIG. 5 is a view of an orientation-flat sensor provided on an aligner unit.
FIG. 5B is a cross-sectional view of the wafer holding and rotating part vacuum chuck.
Figure 5B:
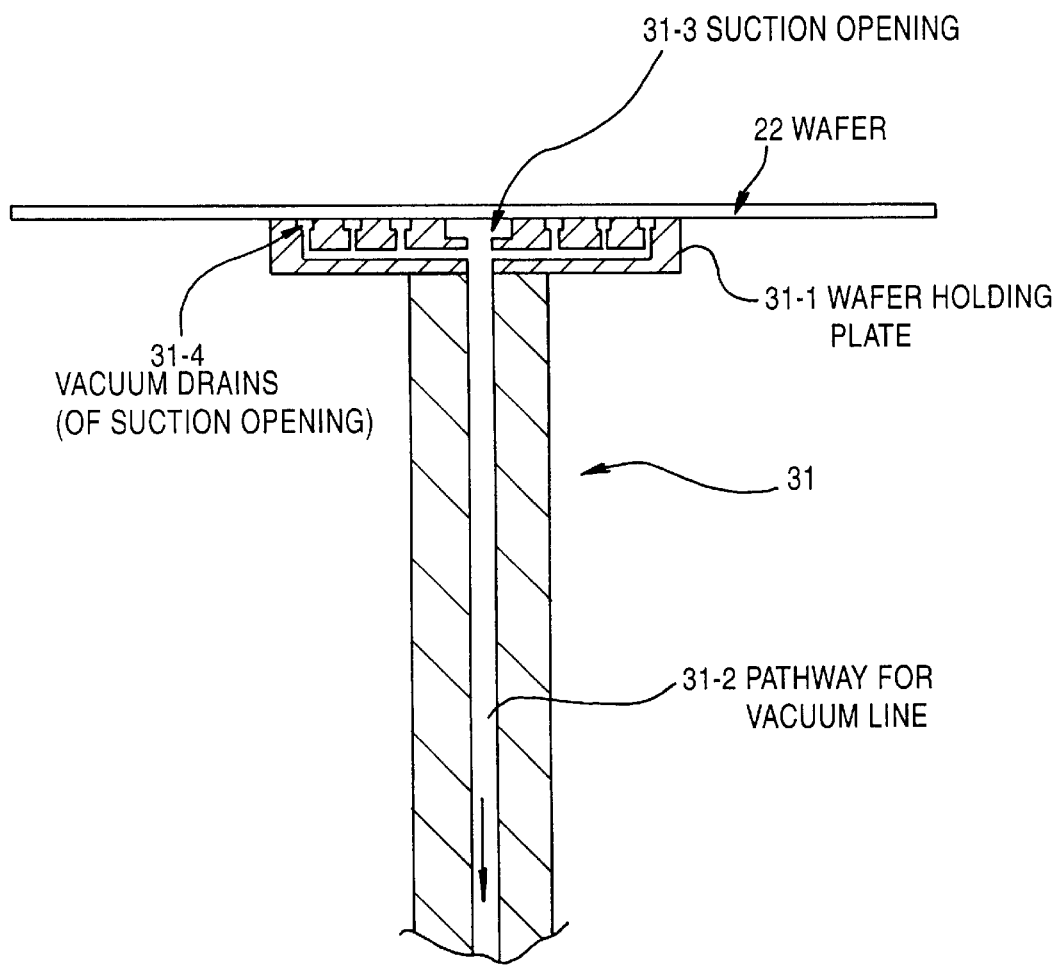

The orientation-flat (notch) detection part 33 contains a transmission type sensor, as shown in FIGS. 4A, 4B and 5, so as not to interfere with the wafer on the intermediate cassette (shuttle) 30 during the aligning to detect the position of the orientation flat (notch) while the wafer is rotated.

The raising/lowering drive part 34 shown in FIG. 4B can be raised/lowered in a vertical direction. If the wafer in the wafer cassette 60 is projected towards the front of the wafer cassette 60, and this projected wafer is carried by the robot 50, the wafer can be located on the proximally shifted protruding position of the wafer holding and rotating part 31. To prevent this, a protrusion sensor 35 to detect the protrusion is provided at the elevator-type aligner unit 300. This protrusion sensor 35 includes an optical sensor of the transmission type, the reflection type or the limited reflection type, or other electric or mechanical precision-positioning sensors.

Subsequently, description will be made about the positional relationship of the elevator-type aligner unit 300 to the intermediate cassette device (shuttle) 30 with reference to FIGS. 4A and 4B.

The wafer holding shelves in the intermediate cassette device 30 are gate-shaped, and the elevator-type aligner unit 300 is located between the intermediate cassette device (shuttle) 30. The elevator-type aligner unit 300 is installed so that the center of the positioner 32 and the wafer center of the intermediate cassette device 30 are perpendicularly concentric with each other. Successively, description will be made about the aligning and positioning operations of this invention with reference to FIGS. 6A to 6F.

Figure 6A:
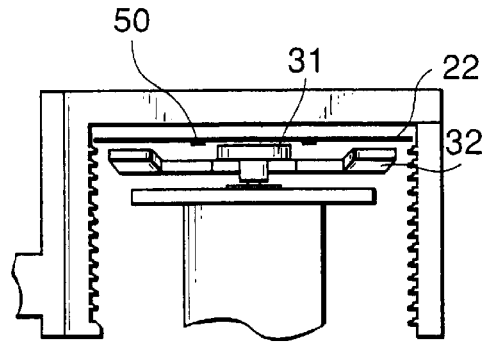
FIGS. 6A to 6F show the aligning positioning operation of the wafer carrying system of this invention.

(1) The elevator-type aligner unit 300 waits at the wafer aligning position of the vertically highest stage of the intermediate cassette device (shuttle) 30, with the positioner 32 in a lowered state, as illustrated in FIG. 6A.

(2) An untreated wafer in the intermediate cassette device 30 is loaded on the wafer holding and rotating part 31 by the handing robot 50. After loading the wafer, the handing robot 50 fetches the next wafer in the cassette. In this event, the next wafer is waited for with the positioner 32 in a lowered condition, and when the next wafer is carried, the positioner 32 is raised to receive the wafer. Alternatively, if the interval between the wafers is large in the intermediate cassette (shuttle) 30, and a clearance (a space) between the wafer and the positioner 32 is sufficient, the next wafer is waited for with the positioner 32 in the raised state, and the wafer carried from the handling robot 50 can be received directly by the positioner 32. In both cases, the operation is then moved to the operation in (4) below, as illustrated in FIG. 6B.

Figure 6D:
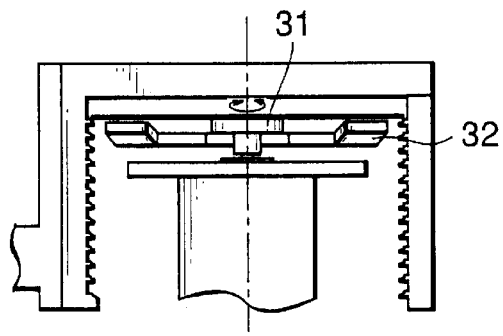
Figure 6B:
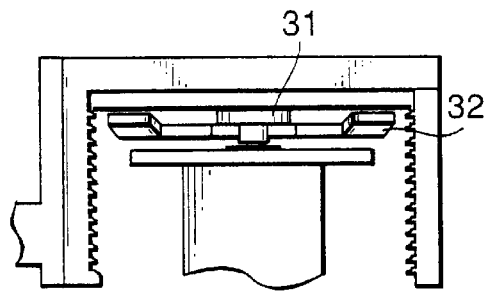
Figure 6E:
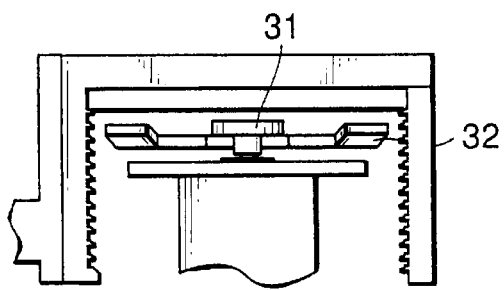
Figure 6C:
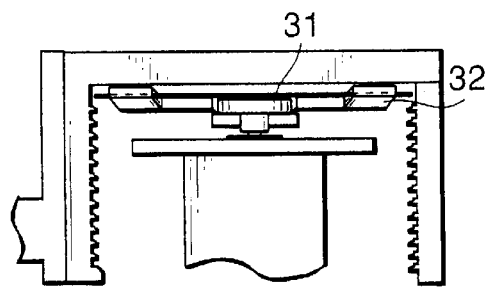

(3) The positioner 32 is raised to center the wafer, as illustrated in FIG. 6C.

(4) The positioner 32 of the wafer holding and rotating part 31 is lowered, and the wafer is held by the wafer holding and rotating part 31, as illustrated in FIG. 6C.

(5) The wafer holding and rotating part 31 is rotated together with the wafer chucked by the vacuum chuck that is placed at the top of the surface of the wafer holding and rotating part 31, the orientation flat (notch) is detected, and the rotation is stopped at the required position, as illustrated in FIG. 6D.

(6) The vacuum chuck is turned OFF. The aligner unit 300 is lowered by 13 mm, and the wafer on the vacuum chuck is delivered to the intermediate cassette (load shuttle) 30. At the same time, the stopping position of this aligner unit 300 becomes the aligning position of the second wafer, as illustrated in FIG. 6E.

(7) The second wafer is put on the chuck. The wafers are treated successively from the upper stage by repeating this process.

Figure 6F:
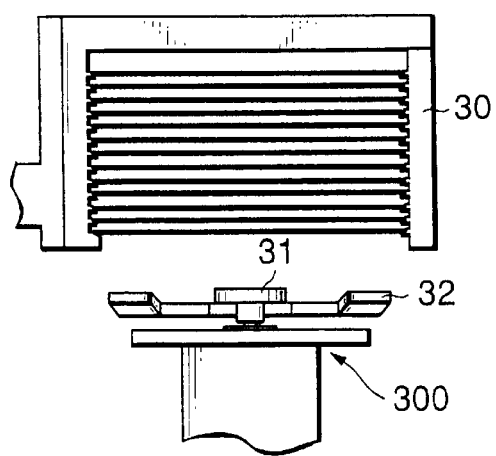

(8) When the aligning of the wafer on the lowest stage is completed, the aligner unit 300 is lowered to a position to avoid interference with the rotational motion of the intermediate cassette (shuttle) 30, as illustrated in FIG. 6F.

(9) The intermediate cassette (shuttle) 30 is rotated to the main cassette device (vacuum cassette) 20 to deliver the wafers.

(10) The intermediate cassette (shuttle) 30 returns to the original position in an empty state.

(11) The operation is repeated from the operation in (1).

(Second Embodiment)

Figure 7:
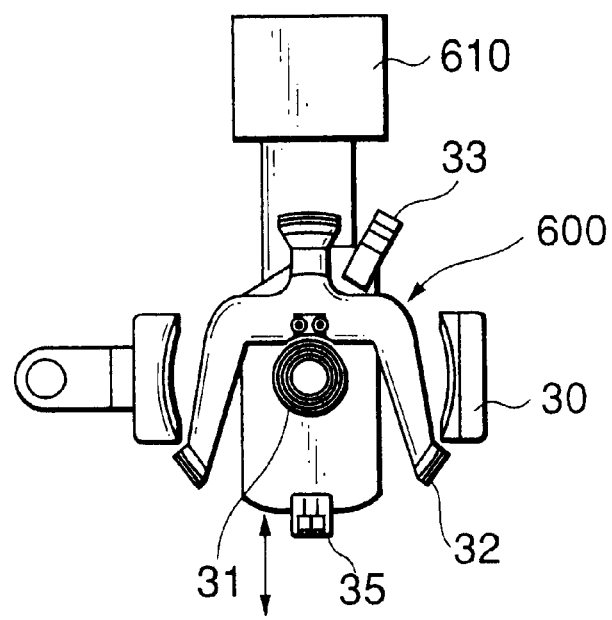
FIG. 7 is a view of the wafer carrying system according to a second embodiment of this invention.

Referring to FIG. 7, description will be made about a second embodiment of this invention.

In the second embodiment, as shown in FIG. 7, an aligner unit 600 is horizontally moved to the intermediate cassette device 30 so that the center of the aligner unit 600 and the center of the intermediate cassette device 30 are located substantially concentric with each other.

With such a structure, this aligner unit 600 is horizontally moved by a horizontal-movement cylinder 610. During the aligning operation, the wafer is sucked by the vacuum chuck to the aligner unit 600.

(Third Embodiment)

Figure 8:
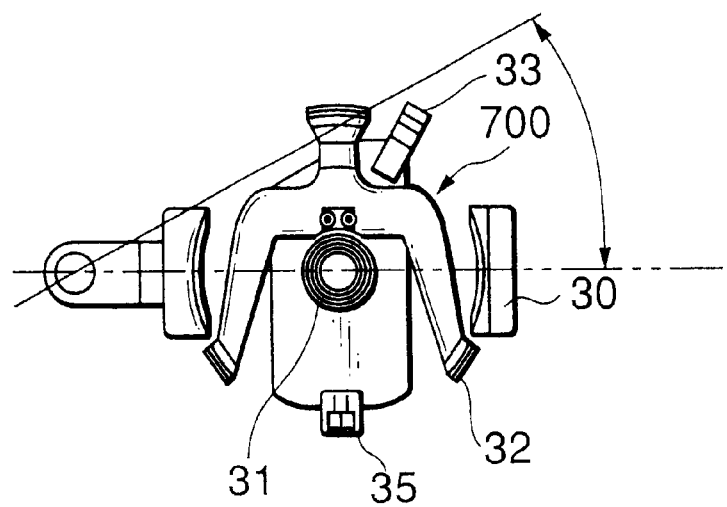
FIG. 8 is a view of the wafer carrying system according to a third embodiment of this invention.

Referring to FIG. 8, description will be made about a third embodiment of this invention.

In the third embodiment, as shown in FIG. 8, the intermediate cassette device 30 is horizontally moved to an aligner unit 700 so that the center of the aligner unit 700 and the wafer loading center of the intermediate cassette device 30 are located substantially concentric with each other. During the aligning operation, the wafer is sucked by the vacuum chuck to the aligner unit 700.

(Fourth Embodiment)

Figure 9:
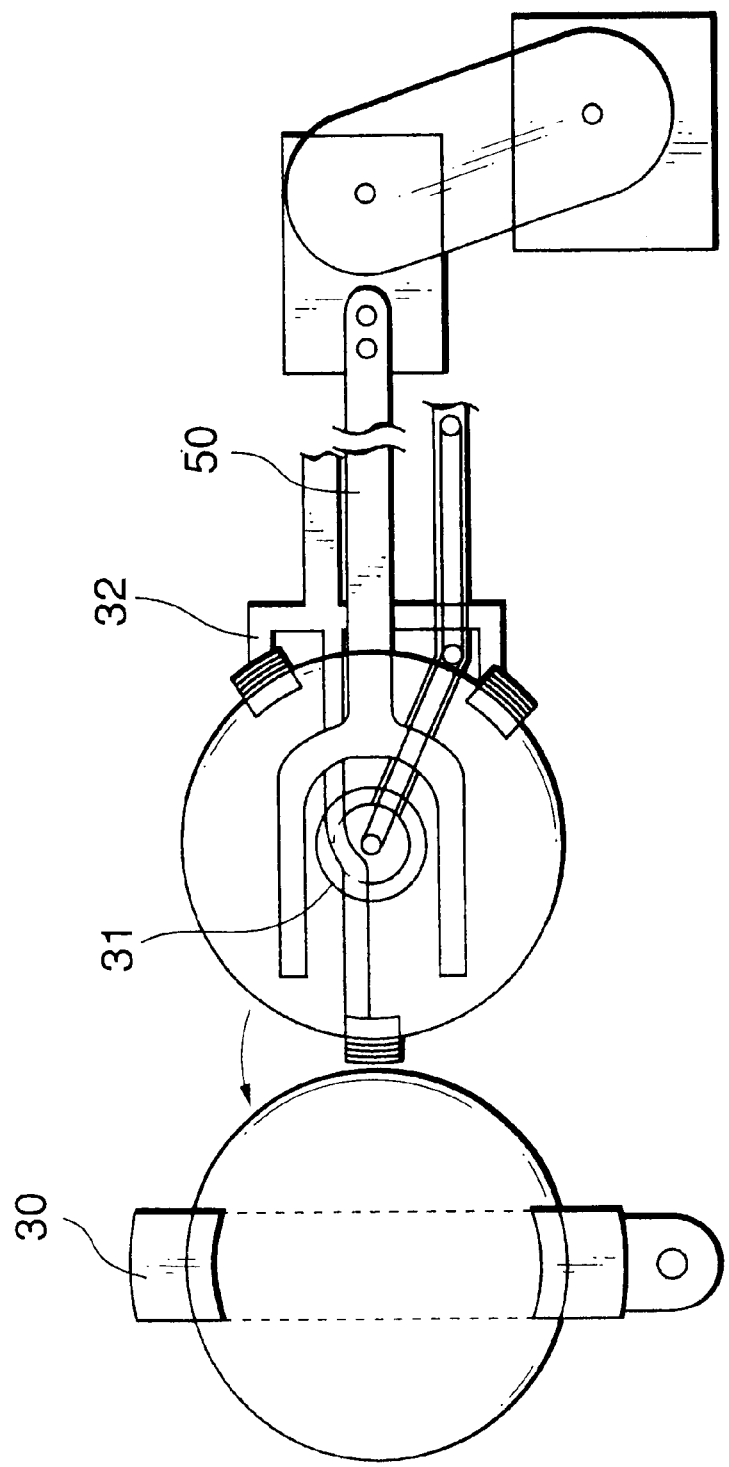
FIG. 9 is a view of a wafer carrying system according to a fourth embodiment of this invention.

Referring to FIG. 9, description will be made about a fourth embodiment of this invention.

In the fourth embodiment, the aligner unit is disposed on the wafer-loading-center locus on a wafer insertion path of the intermediate cassette device 30, and the aligner unit is horizontally moved to receive the wafer from the robot arm 50.

The aligner unit is horizontally moved to receive the wafer from the robot arm 50, and the intermediate cassette device 30 is vertically moved to deliver the wafer.

(Fifth Embodiment)

Figure 10:
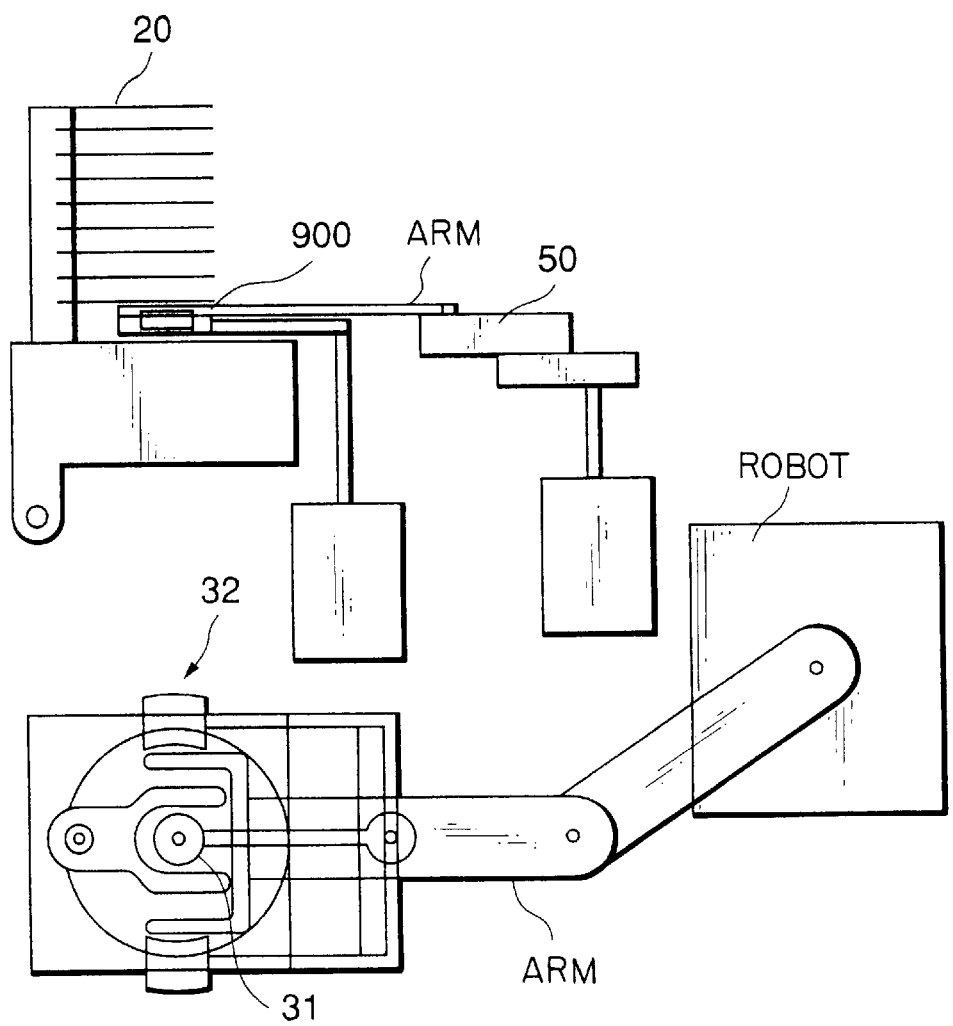
FIG. 10 is a view of a wafer carrying system according to a fifth embodiment of this invention.

Referring to FIG. 10, description will be made about a fifth embodiment of this invention.

In the fifth embodiment, an aligner unit 900 can advance into a holding part of the main cassette device 20, and the main cassette device 20 or the aligner unit 900 is vertically moved to receive the wafer from the aligner unit 900.

In the fifth embodiment, no intermediate cassette 30 is present, and the main cassette device 20 receives the wafer directly from the aligner unit 900 via the robot arm device 50.

(Other Embodiments)

While this invention has thus far been disclosed in conjunction with several embodiments thereof, it will be readily possible for those skilled in the art to put this invention into practice in the various other manners.

For example, in other embodiments, an aligner unit may be installed on the wafer feed cassette 60 shown in FIG. 2.

In the above-described embodiments, the aligner unit includes the positioner, and the wafer is centered by this positioner.

However, in other embodiments, the wafer may be centered by providing the positioner not on the aligner unit itself, but independently on another part (for example, a shuttle shelf.

What is claimed is:

1. A wafer carrying system, comprising:
an intermediate cassette device which has a plurality of wafer support holders;
a robot arm device which carries a wafer;
an aligner unit which is mounted below and extendable into the intermediate cassette device to align the wafer; and
a wafer feed and storage cassette,
wherein the wafer held by said robot arm device is transferred to said aligner unit, aligned in said intermediate cassette device, and then, directly delivered from said aligner unit to said plurality of wafer support holders of said intermediate cassette device.

2. A wafer carrying system as claimed in claim 1, wherein:

said aligner unit has a positioner, and the wafer is centered by said positioner and transferred to a wafer holding and rotating part by moving said wafer holding and rotating part of said aligner unit or said positioner in a vertical direction.

3. A wafer carrying system as claimed in claim 2, wherein:

the center of said positioner of said aligner unit and the center of said wafer holding and rotating part of said aligner unit are disposed concentrically with each other in the vertical direction.

4. A wafer carrying system as claimed in claim 2, wherein:

said positioner and said wafer holding and rotating part of said aligner unit are vertically raised/lowered among the open-bottom cavity space part of said plurality of wafer support holders of said intermediate cassette device.

5. A wafer carrying system as claimed in claim 2, wherein:

said positioner is provided in a concentric manner on said aligner unit; and the wafer centered by the positioner on said aligner unit is transferred to said wafer holding and rotating part of said aligner unit, and is delivered to a next process by moving the whole aligner unit in a vertical direction.

6. A wafer carrying system as claimed in claim 1, wherein:

the center of said aligner unit and the wafer loading center of said intermediate cassette device are disposed concentrically with each other.

7. A wafer carrying system as claimed in claim 1, wherein:

said aligner unit, which receives a wafer, is horizontally moved to said intermediate cassette device to transfer the wafer so that the center of said aligner unit and the wafer loading center of the intermediate cassette device are located concentrically with each other.

8. A wafer carrying system as claimed in claim 1, wherein:

said intermediate cassette device is horizontally moved to said aligner unit so that the center of said aligner unit and the wafer loading center of said intermediate cassette device are located concentrically with each other.

9. A wafer carrying system as claimed in claim 1, wherein:

said aligner unit is vertically raised/lowered, and each wafer which is put on the said aligner unit is successively loaded from the said aligner unit to the stage (from an upper end to a lower end of it) of said plurality of wafer support holders of said intermediate cassette device by the raising/lowering operation of said aligner unit.

10. A wafer carrying system as claimed in claim 9, wherein:

the said aligner unit is horizontally moved, and the said aligner unit receives the wafer from said robot arm device, and said intermediate cassette device is vertically moved to transfer the wafer from the said aligner unit to the said intermediate cassette device.

11. A wafer carrying system as claimed in claim 1, wherein:

said aligner unit is disposed on a wafer-loading center locus on a wafer insertion path of said intermediate cassette device, and the said aligner unit is horizontally moved, and the said aligner unit receives the wafer from said robot arm device.

12. A wafer carrying system as claimed in claim 1 wherein:

said plurality of wafer support holders of said intermediate cassette device have an open-bottom cavity space part, and said aligner unit is vertically raised/lowered among the cavity space part.

13. A wafer carrying system as claimed in claim 1, wherein:

said intermediate cassette device has a vertically raising/lowering system, and said intermediate cassette device is vertically raised/lowered, and the wafers are successively transferred from said aligner unit to said plurality of wafer support holders of said intermediate cassette device, and moved from an upper stage to a lower stage of said intermediate cassette device by the raising/lowering operation of said intermediate cassette device.

14. A wafer carrying system as claimed in claim 1, wherein:

said aligner unit is disposed on the horizontal moving line of said intermediate cassette device or on a wafer-loading-center locus in the rotation by the shuttle drive, to deliver a wafer, said intermediate cassette device is horizontally moved toward the aligner unit, and said aligner unit is vertically moved and delivered the wafer from said aligner unit to said intermediate cassette device.

15. A wafer carrying system as claimed in claim 14, wherein:

to deliver the wafer, said intermediate cassette device is horizontally moved toward the aligner unit, and said intermediate cassette device is vertically moved and delivered the wafer from said aligner unit to said intermediate cassette device.

16. A wafer carrying system as claimed in claim 1, wherein:

a wafer is delivered from said robot arm device to said aligner unit, the vertical position of said aligner unit can be changed by up/down movement, and said aligner unit or said intermediate cassette is vertically moved to receive and transfer the wafer.

17. A wafer carrying system as claimed in claim 1, wherein:

transferring wafers from the wafer feed cassette, said robot arm device is vertically moved during the carriage of a wafer from said wafer feed cassette, and delivering wafers to said aligner unit, the vertical position of said aligner unit can be changed by up/down movement, and said aligner unit or said intermediate cassette is vertically moved to receive and transfer the wafer.

18. A wafer carrying system as claimed in claim 1, wherein:

the wafers are loaded in the empty wafer holding shelves of the intermediate cassette device, the intermediate cassette device is unloaded, then the same reloading process occurs.

19. A wafer carrying system as claimed in claim 1 wherein:

a sensor for detecting an orientation flat (or notch) of said wafer is installed in an inclined stance on said aligner unit.

20. A wafer carrying system as claimed in claim 1, wherein:
an untreated wafer is automatically carried into a wafer treatment chamber from a vacuum container, and
a treated wafer is automatically carried out of the wafer treatment chamber to the vacuum container.

21. A wafer carrying system as claimed in claim 20, wherein:
a main cassette device which has untreated or treated wafers is stored in a sealed box for continuous transfer into said wafer treatment chamber.

22. A wafer carrying system as claimed in claim 21, wherein:
said aligner unit is advanced into a holding part of said main cassette device, and said main cassette device or said aligner unit is vertically moved to receive or to transfer a wafer from said aligner unit.

23. A wafer carrying system as claimed in claim 1, wherein:
said feed and storage cassette device is stored in a sealed box for continuous transfer into a clean room.

24. A wafer carrying system as claimed in claim 1, wherein:
said robot arm device is horizontally movable between a plurality of the wafer feed cassettes.

25. A wafer carrying system, comprising:
a wafer carrying device which collectively deliver a plurality of wafers between a plurality of wafer holding shelves in a vacuum cassette device provided in a treatment device in a vacuum chamber, and
a wafer-loading shuttle device and a wafer-unloading shuttle device which are disposed at the side of said vacuum cassette device,
said shuttle devices including shuttle cassettes having a plurality of wafer support holders corresponding to a plurality of said wafer holding shelves of said vacuum cassette device,
said shuttle cassette being movable between a delivery position to deliver said wafers to/from said cassette device and a waiting position distant therefrom,
each of said plurality of wafer holding shelves holding said wafer in each center area,
said plurality of wafer support holders supporting each wafer at positions on both sides in the diameter direction and away from the center area,
wherein; an aligner unit is disposed in a carrying path to said shuttle device,
said wafer held by a robot arm device is transferred to said aligner unit in said shuttle device, which is said intermediate cassette device, and
said wafers are aligned, and directly delivered from said aligner unit to said wafer support holders of said shuttle device, which is said intermediate cassette device.

26. A wafer carrying method for a wafer carrying system including an intermediate cassette device having a plurality of wafer support holders, a robot arm device to carry a wafer, an aligner unit to align the wafer, and a wafer feed and storage cassette, and delivering the wafer to the wafer support holder after the wafer is aligned, said method comprising the steps of:
taking out the wafer from said feed and storage cassette by said robot arm device to said intermediate cassette device;
transferring said held wafer to the wafer support device of said intermediate cassette device;
transferring the wafer to said aligner unit and aligning said wafer; and
directly delivering said aligned wafer to the wafer support holder of said intermediate cassette device in said aligner unit.

* * * * *